(12) United States Patent
Gaertner et al.

(10) Patent No.: US 9,379,286 B2
(45) Date of Patent: Jun. 28, 2016

(54) OPTOELECTRONIC SEMICONDUCTOR CHIP, AND LIGHT SOURCE COMPRISING THE OPTOELECTRONIC SEMICONDUCTOR CHIP

(71) Applicant: OSRAM Opto Semiconductors GmbH, Regensburg (DE)

(72) Inventors: Christian Gaertner, Regensburg (DE); Thomas Schlereth, Regensburg (DE); Stephan Kaiser, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/428,952

(22) PCT Filed: Sep. 6, 2013

(86) PCT No.: PCT/EP2013/068478
§ 371 (c)(1),
(2) Date: Mar. 17, 2015

(87) PCT Pub. No.: WO2014/044556
PCT Pub. Date: Mar. 27, 2014

(65) Prior Publication Data
US 2015/0236206 A1    Aug. 20, 2015

(30) Foreign Application Priority Data

Sep. 18, 2012   (DE) .................. 10 2012 108 763

(51) Int. Cl.
*H01L 33/38* (2010.01)
*H01L 33/10* (2010.01)
(Continued)

(52) U.S. Cl.
CPC ............... *H01L 33/38* (2013.01); *H01L 33/08* (2013.01); *H01L 33/10* (2013.01); *H01L 33/14* (2013.01)

(58) Field of Classification Search
None
See application file for complete search history.

(56) References Cited

U.S. PATENT DOCUMENTS 4,794,494 A * 12/1988 Reeder ................ B60Q 1/1438
                                                                    362/290
7,188,984 B2 * 3/2007 Sayers ................ F21S 48/1208
                                                                    362/240

(Continued)

FOREIGN PATENT DOCUMENTS

DE  102006039369 A1   7/2007
DE  102006046037 A1   4/2008

(Continued)

*Primary Examiner* — Anthony Ho
*Assistant Examiner* — Kevin Quinto
(74) *Attorney, Agent, or Firm* — McDermott Will & Emery LLP

(57) ABSTRACT

An optoelectronic semiconductor chip (10) is specified, comprising a semiconductor layer sequence (20) having at least two active regions (21, 22) arranged one above another, wherein the active regions (21, 22) each have a first semiconductor region (3) of a first conduction type, a second semiconductor region (5) of a second conduction type and a radiation-emitting active layer (4) arranged between the first semiconductor region (3) and the second semiconductor region (5). The optoelectronic semiconductor chip (10) comprises a mirror layer (6), which is arranged at a side of the semiconductor layer sequence (20) facing away from a radiation exit surface (13), and at least two electrical contacts (11, 12) which are arranged at a side of the mirror layer (6) facing away from the radiation exit surface (13). Furthermore, a light source (30) comprising the optoelectronic semiconductor chip (10) is specified.

14 Claims, 2 Drawing Sheets

Figure 1:
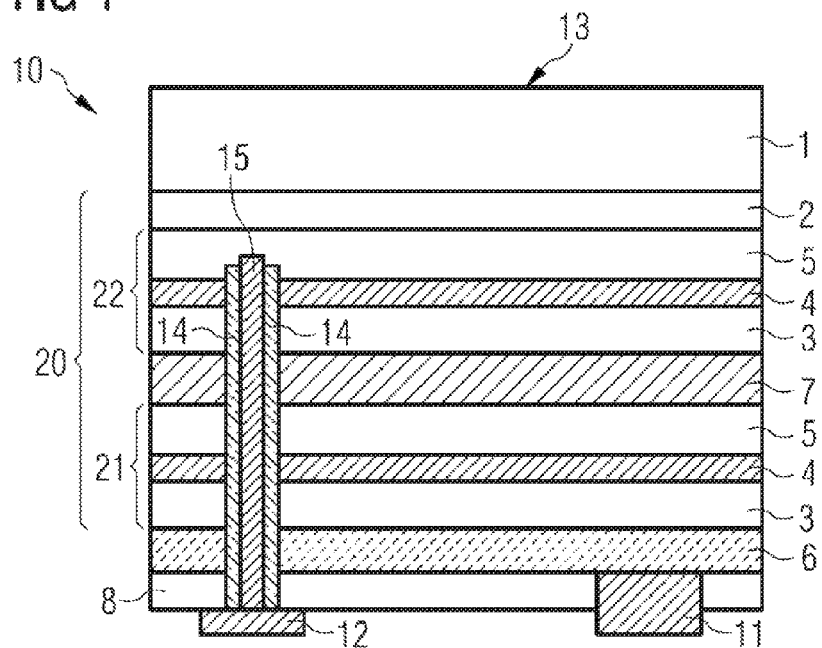

(51) Int. Cl.
*H01L 33/14* (2010.01)
*H01L 33/08* (2010.01)

(56) References Cited

U.S. PATENT DOCUMENTS

| | | | |
|---|---|---|---|
| 2005/0067627 A1* | 3/2005 | Shen | H01L 33/08 257/89 |
| 2006/0027820 A1 | 2/2006 | Cao | |
| 2007/0170444 A1 | 7/2007 | Cao | |
| 2012/0094414 A1* | 4/2012 | Or-Bach | H01L 27/15 438/33 |

FOREIGN PATENT DOCUMENTS

| | | |
|---|---|---|
| DE | 102008011848 A1 | 9/2009 |
| DE | 102008016525 A1 | 11/2009 |
| DE | 102008035900 A1 | 11/2009 |
| DE | 10 2009 006 177 A1 | 6/2010 |

* cited by examiner

OPTOELECTRONIC SEMICONDUCTOR CHIP, AND LIGHT SOURCE COMPRISING THE OPTOELECTRONIC SEMICONDUCTOR CHIP

The invention relates to an optoelectronic semiconductor chip and to a light source comprising the optoelectronic semiconductor chip.

This patent application claims the priority of German patent application 10 2012 108 763.6, the disclosure content of which is hereby incorporated by reference.

The invention is based on the object of specifying an optoelectronic semiconductor chip which is distinguished by a high luminous flux despite compact dimensions, and in particular can be mounted on surfaces without a bonding wire. Furthermore, the intention is to specify an advantageous light source comprising the optoelectronic semiconductor chip.

These objects are achieved by means of an optoelectronic semiconductor chip and a light source according to the independent patent claims. The dependent claims relate to advantageous configurations and developments of the invention.

In accordance with at least one configuration, the optoelectronic semiconductor chip comprises a semiconductor layer sequence having at least two active regions arranged one above another. The active regions advantageously each have a first semiconductor region of a first conduction type, in particular a p-type semiconductor region, and a second semiconductor region of a second conduction type, in particular an n-type semiconductor region. A radiation-emitting active layer is arranged between the first semiconductor region and the second semiconductor region.

The optoelectronic semiconductor chip comprises a radiation exit surface, through which electromagnetic radiation generated in the at least two active regions is emitted. The radiation exit surface can be planar or curved. Furthermore, the radiation exit surface can be provided with a superstructure or roughening. A mirror layer is advantageously arranged at a side of the semiconductor layer sequence facing away from the radiation exit surface.

Furthermore, the optoelectronic semiconductor chip advantageously comprises at least two electrical contacts, which are arranged at a side of the mirror layer facing away from the radiation exit surface.

By virtue of the fact that the semiconductor layer sequence has at least two active regions arranged one above another and each containing a radiation-emitting active layer, with the optoelectronic semiconductor chip it is advantageously possible to generate a greater luminous flux than with a comparable optoelectronic semiconductor chip comprising only a single active layer.

The luminous efficiency of the optoelectronic semiconductor chip is advantageously increased further by virtue of the fact that a mirror layer is arranged at a side of the semiconductor layer sequence facing away from the radiation exit surface. The electromagnetic radiation which is generated in the active regions and which is emitted in the direction of a rear side of the semiconductor chip, said rear side being situated opposite the radiation exit surface, is reflected toward the radiation exit surface by the mirror layer. By virtue of the fact that the at least two electrical contacts with which the semiconductor layer sequence is electrically contacted are arranged at a side of the mirror layer facing away from the radiation exit surface, the radiation exit surface of the optoelectronic semiconductor chip is advantageously free of electrical contacts and/or bonding wires. Absorption of radiation by contact layers on the radiation exit surface is advantageously avoided in this way and the luminous efficiency is thus increased further.

At the at least two electrical contacts at the side of the mirror layer facing away from the radiation exit surface, the optoelectronic semiconductor chip is advantageously mountable onto a surface. By way of example, at the electrical contacts the optoelectronic semiconductor chip can be connected to a printed circuit board, in particular soldered onto a printed circuit board. It is also possible for the optoelectronic semiconductor chip to be connected to a leadframe of a chip housing, for example of a reflector housing, at the at least two electrical contacts. The optoelectronic semiconductor chip is in particular a surface-mountable semiconductor chip.

In one configuration of the optoelectronic semiconductor chip, the semiconductor layer sequence has a substrate, wherein the substrate is arranged at an opposite side of the semiconductor layer sequence relative to the mirror layer. The substrate can be in particular an epitaxy substrate onto which the semiconductor layer sequence is grown epitaxially. In this configuration, the radiation exit surface of the optoelectronic semiconductor chip is advantageously a surface of the substrate facing away from the semiconductor layer sequence. The surface of the substrate serving as the radiation exit surface can be provided with a roughening or a coupling-out structure, for example, in order to further improve the coupling-out of radiation from the optoelectronic semiconductor chip.

The optoelectronic semiconductor chip is embodied in particular as a so-called flip-chip, which is mountable with the top side facing downward in relation to the growth direction of the semiconductor layer sequence. In other words, the semiconductor layer grown first onto the epitaxy substrate is adjacent to the radiation exit surface and the semiconductor layer grown last is adjacent to the mirror layer at a rear side of the semiconductor chip situated opposite the radiation exit surface. The semiconductor regions of the semiconductor layer sequence are preferably arranged in the active regions in each case in such a way that the n-type semiconductor region in each case faces the radiation exit surface and the p-type semiconductor region in each case faces the mirror layer.

The substrate of the optoelectronic semiconductor chip advantageously comprises a material which is transparent to the radiation emitted by the active regions. The transparent substrate can comprise e.g. sapphire, SiC or, in the case of a semiconductor chip which emits in the infrared spectral range, silicon.

In an alternative configuration of the optoelectronic semiconductor chip, the substrate is detached from the semiconductor layer sequence. A so-called thin-film semiconductor chip is involved in this configuration.

In one configuration of the optoelectronic semiconductor chip, the at least two electrical contacts comprise a first electrical contact, which is connected to the first semiconductor region of an active region closest to the mirror layer, and a second electrical contact, which is connected to the second semiconductor region of an active region closest to the radiation exit surface. In the active regions preferably in each case the first semiconductor region faces the mirror layer and the second semiconductor region faces the radiation exit surface. Preferably, in each case the first semiconductor region is a p-type semiconductor region and the second semiconductor region is an n-type semiconductor region. By virtue of the fact that the first electrical contact is connected to the first semiconductor region of the region closest to the mirror layer and the second electrical contact is connected to the second semiconductor region of the active region closest to the radiation exit surface, the two electrical contacts are connected to the two outer semiconductor regions of the outer active regions. In this way, the plurality of active regions arranged one above another can be connected in series, in particular.

The first electrical contact is preferably connected to the first semiconductor region of the active region closest to the mirror layer by virtue of the fact that the mirror layer is electrically conductive, the mirror layer adjoins the first semiconductor region of an active region closest to the mirror layer, and the first electrical contact is electrically conductively connected to the mirror layer. In this configuration, the second electrical contact, which like the first electrical contact is arranged at a side of the mirror layer facing away from the semiconductor layer sequence, is advantageously electrically insulated from the mirror layer by means of an electrically insulating layer.

The second electrical contact is preferably electrically connected to the second semiconductor region of the active region closest to the radiation exit surface by means of at least one via led through the mirror layer and the semiconductor layer sequence. In this way, the semiconductor region closest to the radiation exit surface is electrically connected to the second electrical contact, without contacts being necessary in the region of the radiation exit surface or of the side surfaces of the optoelectronic semiconductor chip. In the region of the perforation, the via is insulated from the mirror layer and the semiconductor layers by means of an electrically insulating layer.

In one configuration, a current spreading layer is arranged between the mirror layer and the electrical contacts, said current spreading layer being electrically conductively connected to the second electrical contact. In this configuration, the current spreading layer is preferably insulated from the mirror layer by means of a first electrically insulating layer and insulated from the first electrical contact by means of a second electrically insulating layer.

Furthermore, in this configuration, the second electrical contact is advantageously electrically connected to the second semiconductor region of the active region closest to the radiation exit surface by means of a plurality of vias led in each case from the current spreading layer through the mirror layer and the semiconductor layer sequence. What is advantageously achieved by means of the current spreading layer and the plurality of vias is that the second electrical contact is electrically connected at a plurality of locations to the second semiconductor region of the active region closest to the radiation exit surface. The homogeneity of the current distribution in the optoelectronic semiconductor chip is advantageously improved in this way.

For the first electrical contact, the mirror layer can advantageously function as a current spreading layer, wherein the mirror layer preferably comprises a metal or a metal alloy such as, for example, aluminum or silver. Aluminum and silver are distinguished both by a high electrical conductivity and by a high reflection.

In one configuration of the optoelectronic semiconductor chip, the at least two active regions are electrically connected to one another by a tunnel junction. If the optoelectronic semiconductor chip comprises more than two active regions, a tunnel junction is preferably arranged in each case between two adjacent active regions. The active regions are connected in series, in particular, by the at least one tunnel junction. The number of active regions arranged one above another is for example at least two, at least three or even at least five.

In one preferred configuration, the optoelectronic semiconductor chip comprises at least one further electrical contact, which is connected to a semiconductor region of one of the active regions, wherein the semiconductor region is not connected to the first or second electrical contact. In this configuration, the outer semiconductor regions of the outer active regions are advantageously contacted by the first and second electrical contacts, wherein the further electrical contact makes contact with a semiconductor region in the interior of the semiconductor layer sequence. The further electrical contact thus forms an intermediate contact which enables one or a plurality of active regions to be contacted separately in a targeted manner.

By way of example, all the active regions connected in series can be contacted by the first and second electrical contacts. If the optoelectronic semiconductor chip comprises the further electrical contact in addition to the first electrical contact and the second electrical contact, a first portion of the active regions can be contacted for example by contacting of the first electrical contact and of the further contact. A further portion of the active regions can be contacted by the contacting of the further electrical contact and of the second electrical contact. It is also possible for the optoelectronic semiconductor chip to comprise a plurality of further electrical contacts, in order to be able to selectively make contact with a plurality of individual active regions or groups of active regions. Advantageously, all the active regions are individually contactable by means of one or a plurality of further electrical contacts.

The at least one further electrical contact, like the first electrical contact and the second electrical contact, is advantageously arranged at a side of the mirror layer facing away from the radiation exit surface. Like the second electrical contact, the further electrical contact is preferably connected to the semiconductor region of one of the active regions by means of at least one via led through the mirror layer and the semiconductor layer sequence.

In one advantageous configuration of the optoelectronic semiconductor chip, at least two of the plurality of active regions emit radiation of different wavelengths. In this configuration, the optoelectronic semiconductor chip emits mixed light that arises as a result of color mixing of the radiation emitted by the plurality of active regions. If one or a plurality of active regions of the optoelectronic semiconductor chip are contactable separately by one or a plurality of further contacts, the color of the emitted mixed light can be set in a targeted manner by the choice of the contacted active regions.

Furthermore, a light source comprising the optoelectronic semiconductor chip described above is specified.

In one configuration, the light source comprises a reflector, wherein the at least one optoelectronic semiconductor chip is arranged within the reflector. The at least one optoelectronic semiconductor chip can be arranged in a chip housing, for example. The chip housing of the optoelectronic semiconductor chip is advantageously shaped as a reflector and in this way serves as a beam shaping element in order to obtain a desired angular distribution of the radiation emitted by the optoelectronic semiconductor chip. Alternatively, the at least one optoelectronic semiconductor chip can also be arranged without a chip housing for example on a printed circuit board.

In light sources such as e.g. lamps for general lighting or headlights/spotlights, generally one or a plurality of optoelectronic semiconductor chips each having such a chip housing and/or being arranged on a printed circuit board are arranged within a reflector of the light source, said reflector thus serving as a beam shaping element. By virtue of the fact that a high luminous flux is obtained by means of the plurality of active regions in the optoelectronic semiconductor chip, a high light intensity can be obtained with a comparatively small chip area, such that comparatively small chip housings can be used. This is advantageous particularly because the reflectivity of the chip housings shaped as a reflector is often lower than the reflectivity of a reflector of the light source.

The light source can comprise in particular a luminescence conversion layer suitable for converting at least part of the radiation emitted by the optoelectronic semiconductor chip toward a longer wavelength. In this way, white light can be generated for example with an optoelectronic semiconductor chip which emits in the blue or ultraviolet spectral range. Suitable luminescence conversion substances are known per se and will therefore not be explained in any greater detail.

The optoelectronic semiconductor chip described herein, which has a high luminous flux on account of the plurality of active regions, is suitable in particular for use in a light source comprising a luminescence conversion layer arranged in a manner remote from the semiconductor chip. The luminescence conversion layer can be arranged for example on the inner side of an encapsulation or transparent cover of the light source, such that it does not directly adjoin the optoelectronic semiconductor chip. The light source can be for example a lamp for general lighting which has the shape and the threaded connection of a reflector lamp or incandescent lamp.

In further configurations, the light source is a projector or a headlight/spotlight. The high luminous flux which can be obtained with the optoelectronic semiconductor chip is advantageous when the optoelectronic semiconductor chip is used in a projector or headlight/spotlight. If the optoelectronic semiconductor chip comprises the at least one further electrical contact, it is furthermore advantageous that the wavelength of the light source is variable on account of the possibility for separately driving individual or a plurality of active zones.

The invention is explained in greater detail below on the basis of exemplary embodiments in association with FIGS. 1 to 4.

Figure 2:
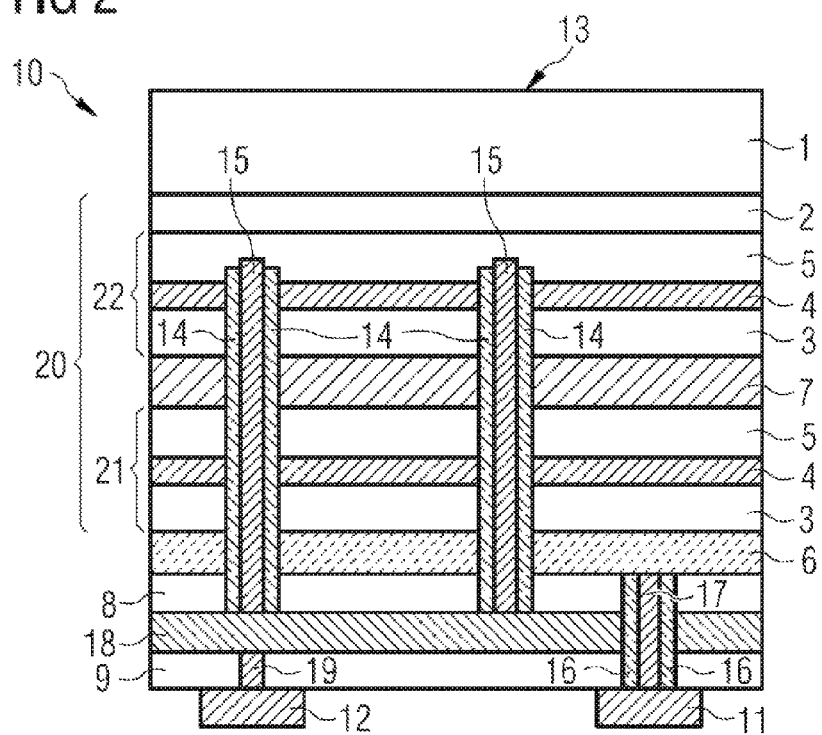
Figure 3:
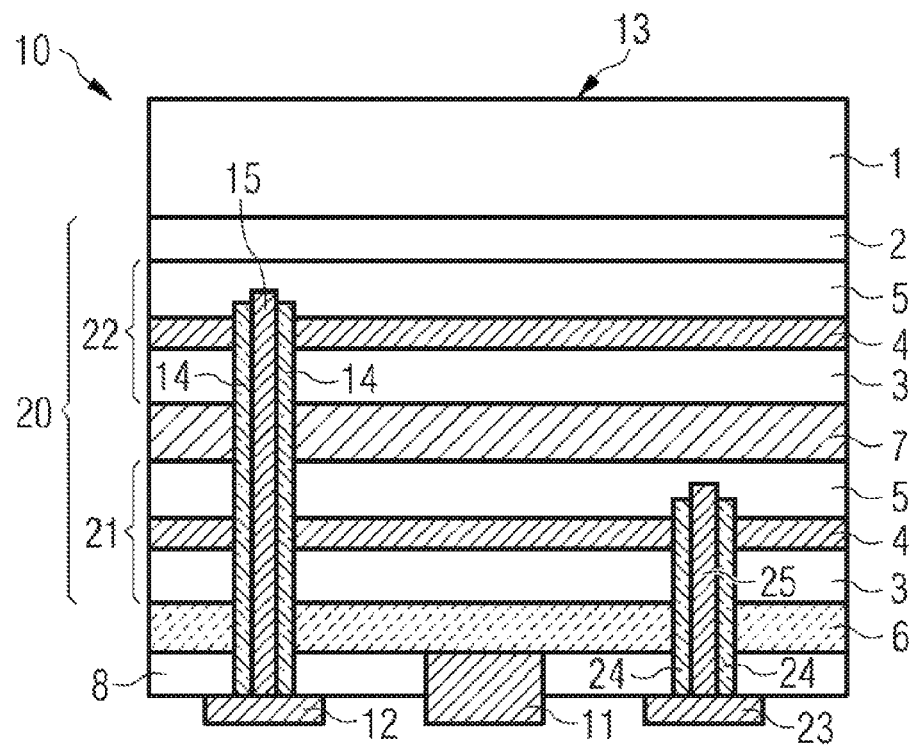
Figure 4:
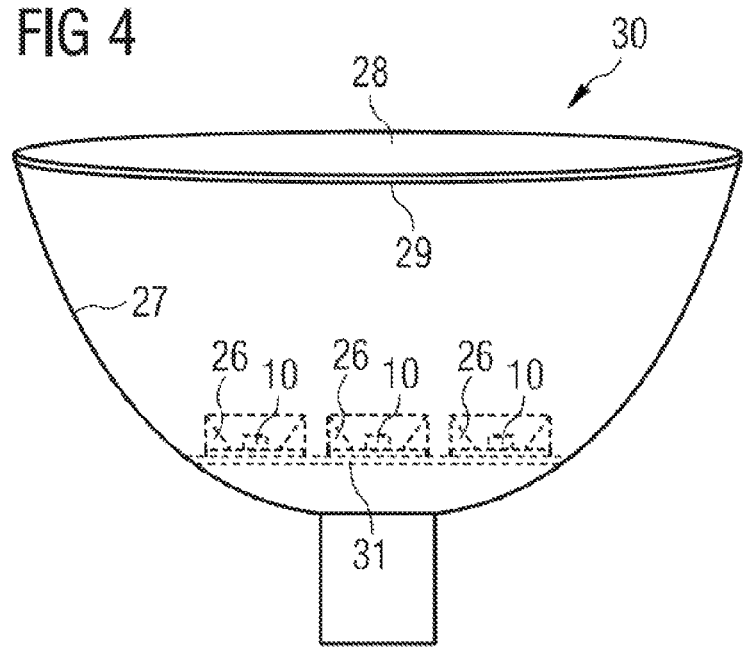

In the figures:

FIG. 1 shows a schematic illustration of a cross section through an optoelectronic semiconductor chip in accordance with a first exemplary embodiment, FIG. 2 shows a schematic illustration of a cross section through an optoelectronic semiconductor chip in accordance with a second exemplary embodiment, FIG. 3 shows a schematic illustration of a cross section through an optoelectronic semiconductor chip in accordance with a third exemplary embodiment, and FIG. 4 shows a schematic illustration of a cross section through a light source comprising a plurality of optoelectronic semiconductor chips in accordance with one exemplary embodiment.

Identical or identically acting component parts are provided with the same reference signs in each case in the figures. The illustrated component parts and the size relationships of the component parts among one another should not be regarded as true to scale.

The exemplary embodiment of the optoelectronic semiconductor chip 10 as illustrated in FIG. 1 comprises a semiconductor layer sequence 20 having a plurality of active regions 21, 22. The active regions 21, 22 are arranged one above another and connected to one another by a tunnel junction 7.

The semiconductor layer sequence 20 of the optoelectronic semiconductor chip 10 is preferably based on a III-V compound semiconductor material, in particular on an arsenide, nitride or phosphide compound semiconductor material. By way of example, the semiconductor layer sequence 20 can contain $In_xAl_yGa_{1-x-y}N$, $In_xAl_yGa_{1-x-y}P$ or $In_xAl_yGa_{1-x-y}As$, in each case where $0 \leq x \leq 1$, $0 \leq y \leq 1$ and $x+y \leq 1$. In this case, the III-V compound semiconductor material need not necessarily comprise a mathematically exact composition according to one of the above formulae. Rather, it can comprise one or more dopants and additional constituents which substantially do not change the physical properties of the material. For the sake of simplicity, however, the above formulae only include the essential constituents of the crystal lattice, even if these can be replaced in part by small amounts of further substances.

The optoelectronic semiconductor chip 10 comprises a substrate 1, on which the semiconductor layer sequence 20 can be grown epitaxially, in particular. One or a plurality of buffer layers 2 can be arranged between the substrate 1 and the active region 22 adjacent to the substrate 1.

The active regions 21, 22 each comprise a first semiconductor region 3, a second semiconductor region 5 and an active layer 4 arranged between the first semiconductor region 3 and the second semiconductor region 5. Preferably, in each case the first semiconductor region 3 is a p-type semiconductor region and the second semiconductor region 5 is an n-type semiconductor region. The active layer 4 is in each case an active layer 4 suitable for emitting radiation. The active layer 4 can be embodied for example as a pn junction, as a double heterostructure, as a single quantum well structure or multi quantum well structure.

The radiation exit surface 13 of the optoelectronic semiconductor chip 10 is formed by a surface of the substrate 1 facing away from the semiconductor layer sequence 20. The optoelectronic semiconductor chip 10 therefore emits radiation through the substrate 1, in particular. Therefore, the substrate 1 is advantageously a transparent substrate, which can comprise in particular silicon, silicon carbide or sapphire.

A mirror layer 6 is advantageously arranged at an opposite side of the semiconductor layer sequence 20 relative to the radiation exit surface 13. Radiation which is emitted by the active layers 4 of the plurality of active regions 21, 22 and which is emitted to a rear side of the semiconductor chip 10 situated opposite the radiation exit surface 13 is reflected in the direction of the radiation exit surface 13 by the mirror layer 6. The radiation efficiency of the optoelectronic semiconductor chip 10 is increased further as a result. The mirror layer 6 is preferably formed from an electrically conductive material. In particular, the mirror layer 6 can contain a metal or a metal alloy. The mirror layer preferably contains aluminum, silver, gold or platinum or consists thereof. These materials are distinguished firstly by a good electrical conductivity and secondly by a high reflectivity.

For electrically contacting the optoelectronic semiconductor chip 10, a first electrical contact 11 and a second electrical contact 12 are arranged at a side of the mirror layer 6 facing away from the semiconductor layer sequence 20. In the optoelectronic semiconductor chip 10, the electrical contacts 11, 12 are arranged at the opposite side of the mirror layer 6 relative to the radiation exit surface 13 and the substrate 1. The radiation exit surface 13 is therefore advantageously free of electrical contact layers. That surface of the substrate 1 which serves as the radiation exit surface 13 and which faces away from the semiconductor layer sequence 20 can be provided for example with a roughening, a coupling-out structure or an antireflection coating.

At the electrical contacts 11, 12, the semiconductor chip 10 can be connected for example to a carrier, in particular to a printed circuit board. Therefore, the optoelectronic semiconductor chip 10 is advantageously surface-mountable. The optoelectronic semiconductor chip 10 can be mounted in particular in such a way that the substrate 1 faces upward and the radiation direction is thus opposite to the growth direction of the semiconductor layer sequence 20. Such an optoelectronic semiconductor chip 10 is also designated as a flip-chip.

In the active regions 21, 22, the semiconductor layers as viewed in the beam direction are arranged opposite to the original growth direction, wherein in the beam direction pointing from the mirror layer 6 to the radiation exit surface 13 in the active regions 21, 22 in each case the first semiconductor region 3, which is preferably a p-type semiconductor region, the active layer 4 and the second semiconductor region 5, which is preferably an n-type semiconductor region, succeed one another. The order of the semiconductor regions in the beam direction is therefore inverted relative to the order during epitaxial growth, during which it is usually the case that firstly the n-type semiconductor region 5, then the active layer 4 and subsequently the p-type semiconductor region 3 are grown.

The first electrical contact 11 is connected to the first semiconductor region 3 of the active region 21 closest to the mirror layer 6. This can be effected, for example, by virtue of the fact that the mirror layer 6 adjoins the first semiconductor region 3 of the active region 21 and the first electrical contact 11 is electrically conductively connected to the mirror layer 6, for example adjoins the mirror layer 6.

The second electrical contact 12 is electrically conductively connected to the second semiconductor region 5 of the active region 22 closest to the radiation exit surface 13. This can be effected, in particular, in such a way that the second electrical contact 12 is electrically conductively connected to the second semiconductor region 5 by means of a via 15 led through the mirror layer 6 and the semiconductor layer sequence 20 right into said second semiconductor region 5 of the active region 22 adjacent to the radiation exit surface 13. The via 15 is electrically insulated from the mirror layer 6 and the other semiconductor layers of the semiconductor layer sequence 20 by means of electrically insulating layers 14. An electrically insulating layer 8 is provided at the side of the mirror layer 6 facing away from the semiconductor layer sequence 20, in order to insulate the second electrical contact 12 from the mirror layer 6.

In this way, a semiconductor region 3 closest to the mirror layer 6 and a semiconductor region 5 closest to the radiation exit surface 13 are electrically connected by means of the first electrical contact 11 and the second electrical contact 12. In this way, the active regions 21, 22 are connected in series, in particular. By virtue of the fact that the optoelectronic semiconductor chip 10 comprises a plurality of active regions 21, 22 connected in series, a luminous flux obtained with the optoelectronic semiconductor chip 10 is advantageously higher than that obtained with a comparable semiconductor chip having an identical area. Therefore, the optoelectronic semiconductor chip 10 can be used in particular in light sources which require a high luminous flux, in particular in projectors or headlights/spotlights. The optoelectronic semiconductor chip 10 can particularly advantageously be used in spotlights for stage lighting.

FIG. 2 schematically illustrates a second exemplary embodiment of the optoelectronic semiconductor chip 10 in cross section. The construction of the semiconductor layer sequence 20 arranged on the substrate 1 and having the active regions 21, 22 corresponds to the first exemplary embodiment. One difference with respect to the first exemplary embodiment illustrated in FIG. 1 is that the second electrical contact 12 is not directly connected to the second semiconductor region 5 of the active region 22 adjacent to the radiation exit surface 13 by means of the via 15. Rather, in the second exemplary embodiment, the second electrical contact 12 is connected to a current spreading layer 18 by means of an electrically conductive connection layer 19. The current spreading layer 18 is arranged on an opposite side of the mirror layer 6 relative to the semiconductor layer sequence 20. In this case, the current spreading layer 18 is insulated from the mirror layer 6 by means of the electrically insulating layer 8. Advantageously two vias 15 proceed from the current spreading layer 18 and are led in each case through the mirror layer 6 and the semiconductor layer sequence 20 as far as the second semiconductor region 5 of the active region 22 adjacent to the radiation exit surface 13. The vias 15 here are electrically insulated from the other semiconductor layers and the mirror layer 6 in each case by means of electrically insulating layers 14. By virtue of the fact that the optoelectronic semiconductor chip 10 comprises a current spreading layer 18 which is connected to the second electrical contact 12 and from which a plurality of vias 15 are led right into the second semiconductor region 5 of the second active region 22 adjacent to the radiation exit surface 13, a more homogeneous current impression into the active regions 21, 22 is obtained.

As in the first exemplary embodiment, the first electrical contact 11 is electrically conductively connected to the mirror layer 6, which adjoins the first semiconductor region 3 of the active region 21 adjacent to the mirror layer 6. Since, in the second exemplary embodiment, the current spreading layer 18 is arranged between the mirror layer 6 and the electrical contacts 11, 12, the first electrical contact 11 is advantageously electrically conductively connected to the mirror layer 6 by means of a via 17 that is insulated from the current spreading layer 18 by electrically insulating layers 16.

Further advantageous configurations of the second exemplary embodiment are evident from the description of the first exemplary embodiment, and vice versa.

The further exemplary embodiment of the optoelectronic semiconductor chip 10 illustrated schematically in cross section in FIG. 3 substantially corresponds to the first exemplary embodiment illustrated in FIG. 1. The difference with respect to the first exemplary embodiment is that the optoelectronic semiconductor chip 10 comprises a further electrical contact 23 in addition to the first electrical contact 11 and the second electrical contact 12, said further electrical contact functioning as an intermediate contact for electrically contacting a semiconductor region 5 that is not connected to the first electrical contact 11 or the second electrical contact 12.

In the exemplary embodiment in FIG. 3, the intermediate contact 23 is electrically conductively connected for example to the second semiconductor region 5 of the active region 21 adjacent to the mirror layer 6. The intermediate contact 23 is electrically conductively connected to the second semiconductor region 5 of the active region 21 by means of a via 25 that is electrically insulated from the other semiconductor layers and the mirror layer 6 by means of electrically insulating layers 24. The intermediate contact 23 advantageously enables the first active region 21, for example, to be contacted separately. If, for example, the first electrical contact 11 and the intermediate contact 23 are connected to a voltage source, only the first active region 21 is operated. By contrast, if the first electrical contact 11 and the second electrical contact 12 are connected to a voltage source, the active regions 21, 22 connected in series are operated.

In a departure from the exemplary embodiment, it is possible for the optoelectronic semiconductor chip 10 to comprise more than two active regions 21, 22. In this case, with one or a plurality of intermediate contacts 23, it is advantageously possible to operate individual or groups of active regions in a targeted manner. In this way, it is possible, in particular, to operate the optoelectronic semiconductor chip 10 with different brightnesses.

The plurality of active regions 21, 22 of the optoelectronic semiconductor chip 10 can have active layers 4 suitable for emitting radiation of different wavelengths. In this case, the optoelectronic semiconductor chip 10 emits a mixed radiation that is emitted by the active regions 21, 22 respectively operated. The targeted operation of individual active regions or of groups of active regions enables a targeted setting of the color and/or of the color temperature of the radiation emitted by the optoelectronic semiconductor chip 10.

Further advantageous configurations of the third exemplary embodiment are evident from the description of the first exemplary embodiment, and vice versa.

FIG. 4 schematically illustrates one exemplary embodiment of a light source 30 comprising a plurality of the optoelectronic semiconductor chips 10 described herein. The optoelectronic semiconductor chips 10 are arranged for example within a reflector 27 of the light source 30. The optoelectronic semiconductor chips 10 can be arranged within the reflector 27 of the light source 30 for example in chip housings 26, wherein the chip housings 26 are arranged for example on a printed circuit board 31. The chip housings 26 are embodied as reflector housings, for example. Alternatively, the optoelectronic semiconductor chips 10 can also be arranged without chip housings 26 on a printed circuit board 31.

By virtue of the fact that a high luminous flux is obtained by means of the plurality of active regions in the optoelectronic semiconductor chips 10, a high light intensity can be obtained with a comparatively small chip area, such that comparatively small chip housings 26 can be used. This is advantageous particularly because the reflectivity of the chip housings 26 shaped as a reflector is often lower than the reflectivity of a reflector 27 of the light source 30.

The light source 30 can comprise, in particular, a luminescence conversion layer 29 suitable for converting at least part of the radiation emitted by the optoelectronic semiconductor chips 10 toward a longer wavelength. In this way, white light can be generated for example with optoelectronic semiconductor chips 10 which emit in the blue or ultraviolet spectral range. Since the optoelectronic semiconductor chips 10 having the plurality of active regions have a high luminous flux, they are suitable in particular for use in a light source 30 comprising a luminescence conversion layer 29 arranged in a manner remote from semiconductor chips 10. The luminescence conversion layer 29 can be arranged for example on the inner side of a transparent cover 28 of the light source 30, such that it does not directly adjoin the optoelectronic semiconductor chips 10. The light source 30 can be for example a lamp for general lighting which has the shape and the threaded connection of a reflector lamp or incandescent lamp.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip, comprising:
a semiconductor layer sequence having at least two active regions arranged one above another, wherein the active regions each have a first semiconductor region of a first conduction type, a second semiconductor region of a second conduction type and a radiation-emitting active layer arranged between the first semiconductor region and the second semiconductor region,
a radiation exit surface,
a mirror layer, which is arranged at a side of the semiconductor layer sequence facing away from the radiation exit surface, and
at least two electrical contacts, which are arranged at a side of the mirror layer facing away from the radiation exit surface, wherein the at least two electrical contacts comprise a first electrical contact and a second electrical contact,
a current spreading layer arranged between the mirror layer and the electrical contacts, said current spreading layer being electrically conductively connected to the second electrical contact, wherein
the current spreading layer is insulated from the mirror layer by means of a first electrically insulating layer and is insulated from the first electrical contact by means of a second electrically insulating layer, and wherein
the second electrical contact is electrically connected to the second semiconductor region of the active region closest to the radiation exit surface by means of a plurality of vias led in each case from the current spreading layer through the mirror layer and the semiconductor layer sequence.

2. The optoelectronic semiconductor chip according to claim 1,
wherein the optoelectronic semiconductor chip is a surface-mountable semiconductor chip.

3. The optoelectronic semiconductor chip according to claim 1,
wherein
the first electrical contact connected to the first semiconductor region of an active region closest to the mirror layer, and
the second electrical contact connected to the second semiconductor region of an active region closest to the radiation exit surface.

4. The optoelectronic semiconductor chip according to claim 1,
wherein the mirror layer is electrically conductive, the mirror layer adjoins the first semiconductor region of an active region closest to the mirror layer, and the first electrical contact is electrically conductively connected to the mirror layer.

5. The optoelectronic semiconductor chip according to claim 1,
wherein the at least two active regions are electrically connected to one another by a tunnel junction.

6. The optoelectronic semiconductor chip according to claim 1,
wherein at least two of the active regions emit radiation of different wavelengths.

7. The optoelectronic semiconductor chip according to claim 1,
wherein the semiconductor layer sequence has a substrate, wherein the substrate is arranged at an opposite side of the semiconductor layer sequence relative to the mirror layer.

8. The optoelectronic semiconductor chip according to claim 7,
wherein a surface of the substrate facing away from the semiconductor layer sequence is the radiation exit surface.

9. The optoelectronic semiconductor chip according to claim 1, which comprises at least one further electrical contact, which is connected to a semiconductor region of one of the active regions, wherein the semiconductor region is not connected to the first electrical contact or second electrical contact.

10. The optoelectronic semiconductor chip according to claim 9,
wherein the at least one further electrical contact is arranged at a side of the mirror layer facing away from the radiation exit surface.

11. A light source, comprising at least one optoelectronic semiconductor chip according to claim 1.

12. The light source according to claim 11,
wherein the light source comprises a reflector, and the optoelectronic semiconductor chip is arranged within the reflector.

13. The light source according to claim 11,
wherein the light source comprises a luminescence conversion layer suitable for converting at least part of the radiation emitted by the optoelectronic semiconductor chip toward a longer wavelength.

14. The light source according to claim 11,
wherein the light source is a projector or a headlight/spotlight.

* * * * *